(12) United States Patent
Sasaki

(10) Patent No.: US 10,958,267 B2
(45) Date of Patent: Mar. 23, 2021

(54) POWER-ON CLEAR CIRCUIT AND SEMICONDUCTOR DEVICE

(71) Applicant: LAPIS SEMICONDUCTOR CO., LTD, Yokohama (JP)

(72) Inventor: Seiichiro Sasaki, Yokohama (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 16/799,117

(22) Filed: Feb. 24, 2020

(65) Prior Publication Data

US 2020/0274532 A1 Aug. 27, 2020

(30) Foreign Application Priority Data

Feb. 27, 2019 (JP) .............................. JP2019-034692

(51) Int. Cl.
*H03K 17/56* (2006.01)
*H03K 19/20* (2006.01)
*G05F 3/08* (2006.01)

(52) U.S. Cl.
CPC ............... *H03K 17/56* (2013.01); *G05F 3/08* (2013.01); *H03K 19/20* (2013.01)

(58) Field of Classification Search
CPC ...... H03K 17/22; H03K 17/223; H03K 17/56; G06F 1/24; G05F 3/02; G05F 3/04; G05F 3/08; G05F 3/10
See application file for complete search history.

(56) References Cited

U.S. PATENT DOCUMENTS

| 4,365,174 | A | * | 12/1982 | Kucharewski | G06F 1/24 327/312 |
| 4,409,501 | A | * | 10/1983 | Eickerman | H03K 17/223 327/143 |
| 2009/0267682 | A1 | * | 10/2009 | Hehemann | H03K 17/223 327/530 |
| 2011/0170657 | A1 | * | 7/2011 | Mandier | H03K 25/02 377/94 |

FOREIGN PATENT DOCUMENTS

JP 5476104 B2 4/2014

* cited by examiner

*Primary Examiner* — An T Luu
(74) *Attorney, Agent, or Firm* — Volentine, Whitt & Francos, PLLC

(57) ABSTRACT

A power-on clear circuit includes a first inverter unit including a constant current transmission unit having one end supplied with a first power supply voltage, and a first transistor having a first terminal connected to a second line kept at a fixed potential, a second terminal connected to the other end of the constant current transmission unit, and a control terminal receiving application of a second power supply voltage which varies to follow the first power supply voltage; a second inverter unit that operates on the basis of the first power supply voltage, and to which a potential of a first node is input, the first node is connected between the other end of the constant current transmission unit and the first terminal of the first transistor; and a signal outputting unit that outputs a power-on clear signal in accordance with an output of the second inverter unit.

4 Claims, 11 Drawing Sheets

POWER-ON CLEAR CIRCUIT AND SEMICONDUCTOR DEVICE

CROSS-REFERENCE TO RELATED APPLICATION

This application is based upon and claims the benefit of priority from the prior Japanese Patent Application No. 2019-034692 filed on Feb. 27, 2019, the entire contents of which are incorporated herein by reference.

BACKGROUND

1. Technical Field

The present invention relates to a power-on clear circuit and a semiconductor device.

2. Description of the Related Art

A semiconductor integrated circuit comprising a circuit operating on the basis of a high power supply voltage VDDHV and a circuit operating on the basis of a low power supply voltage VDDLV has been conventionally used. In such a semiconductor integrated circuit, when only the high power supply voltage VDDHV is supplied as an I/O power supply from the outside, it is necessary to generate the low power supply voltage VDDLV as a core power supply on the basis of the high power supply voltage VDDHV by the operation of a regulator or the like provided in the circuit. A voltage value of the low power supply voltage VDDLV thus generated changes in accordance with change in a voltage value of the high power supply voltage VDDHV. Therefore, in a period immediately after rising of the high power supply voltage VDDHV, a state in which only the high power supply voltage VDDHV rises and the low power supply voltage VDDLV has not yet risen occurs.

In the state in which the low power supply voltage VDDLV has not risen, an output signal of the circuit operating on basis of the low power supply voltage VDDLV becomes an indefinite state in which it is not determined whether the output signal is at an "H" level or at an "L" level. When such an output signal is supplied to a signal output unit connected to an I/O terminal of the semiconductor integrated circuit, for example, an NMOS transistor and a PMOS transistor constituting the signal output unit may be turned on at the same time, so that a through current may be generated. Further, for example, it is possible that the I/O terminal set as an input terminal functions as an output terminal and is short-circuited by connection with an output terminal of another IC. Therefore, in order to avoid such a state, control is performed to supply a power-on clear signal to the signal output unit so that both the NMOS transistor and the PMOS transistor are turned off.

As a circuit for generating the power-on clear signal, a power-on clear circuit using a plurality of cascaded inverters has been proposed (for example, Japanese Patent No. 5476104).

SUMMARY

A power-on clear circuit installed in a semiconductor integrated circuit which operates as a core power supply for the low power supply voltage VDDLV is composed of a plurality of stages of inverters, for example. In such a power-on clear circuit, the low power supply voltage VDDLV is supplied to gates of PMOS transistors and NMOS transistors which constitute an inverter of the first stage, and a power-on clear signal is generated by complementarily controlling a PMOS transistor and an NMOS transistor of each stage to an on/off state.

In such a power-on clear circuit, when the low power supply voltage VDDLV is applied to the gates of the PMOS transistor and the NMOS transistor of the inverter of the first stage, there is a case where an input of the inverter of the first stage becomes an intermediate potential and a through current of several microamperes (μA) may flow. Therefore, there is a problem in that current consumption of the circuit increases.

The present invention has been made in view of the above problem, and an object of the present invention is to provide a power-on clear circuit with reduced current consumption.

According to the present invention, a power-on clear circuit comprises: a first inverter unit including a constant current transmission unit having one end thereof which is connected to a first line which is supplied with a first power supply voltage, said constant current transmission unit being configured to transmit there through a constant current from said one end to the other end thereof, and a first transistor having a first terminal which is connected to a second line which is kept at a fixed potential, a second terminal which is connected to the other end of said constant current transmission unit, and a control terminal for receiving application of a second power supply voltage which varies to follow in magnitude said first power supply voltage and is smaller in magnitude than said first power supply voltage; a second inverter unit configured to operate on the basis of said first power supply voltage, and to which a potential of a first node is input, said first node is connected between the other end of said constant current transmission unit and the first terminal of said first transistor; and a signal outputting unit configured to output a power-on clear signal for controlling an operation state of another circuit operating on the basis of said second power supply voltage in accordance with an output of said second inverter unit.

According to the present invention, a semiconductor device comprises: a regulator circuit configured to reduce in magnitude a first power supply voltage so as to generate a second power supply voltage; a core circuit configured to operate on the basis of said second power supply voltage; a signal input/output terminal connected to said core circuit; and a power-on clear circuit connected to a first line which is supplied with said first power supply voltage and to a second line which is kept at a fixed potential, said power-on clear circuit being configured to generate a power-on clear signal for said signal input/output terminal on the basis of said second power supply voltage, wherein said power-on clear circuit comprises: a first inverter unit including a constant current transmission unit having one end thereof which is connected to said first line, said constant current transmission unit being configured to transmit a constant current there through from said one end to the other end thereof, and a first transistor having a first terminal which is connected to said second line, a second terminal which is connected to the other end of said constant current transmission unit, and a control terminal for receiving application of said second power supply voltage; a second inverter unit configured to operate on the basis of said first power supply voltage, and input a potential of a first node connected between the other end of said constant current transmission unit and the first terminal of said first transistor; and a signal outputting unit configured to output said power-on clear signal in accordance with an output of said second inverter unit.

According to the power-on clear circuit of the present invention, it is possible to suppress an increase in current consumption.

DETAILED DESCRIPTION

Figure 1:
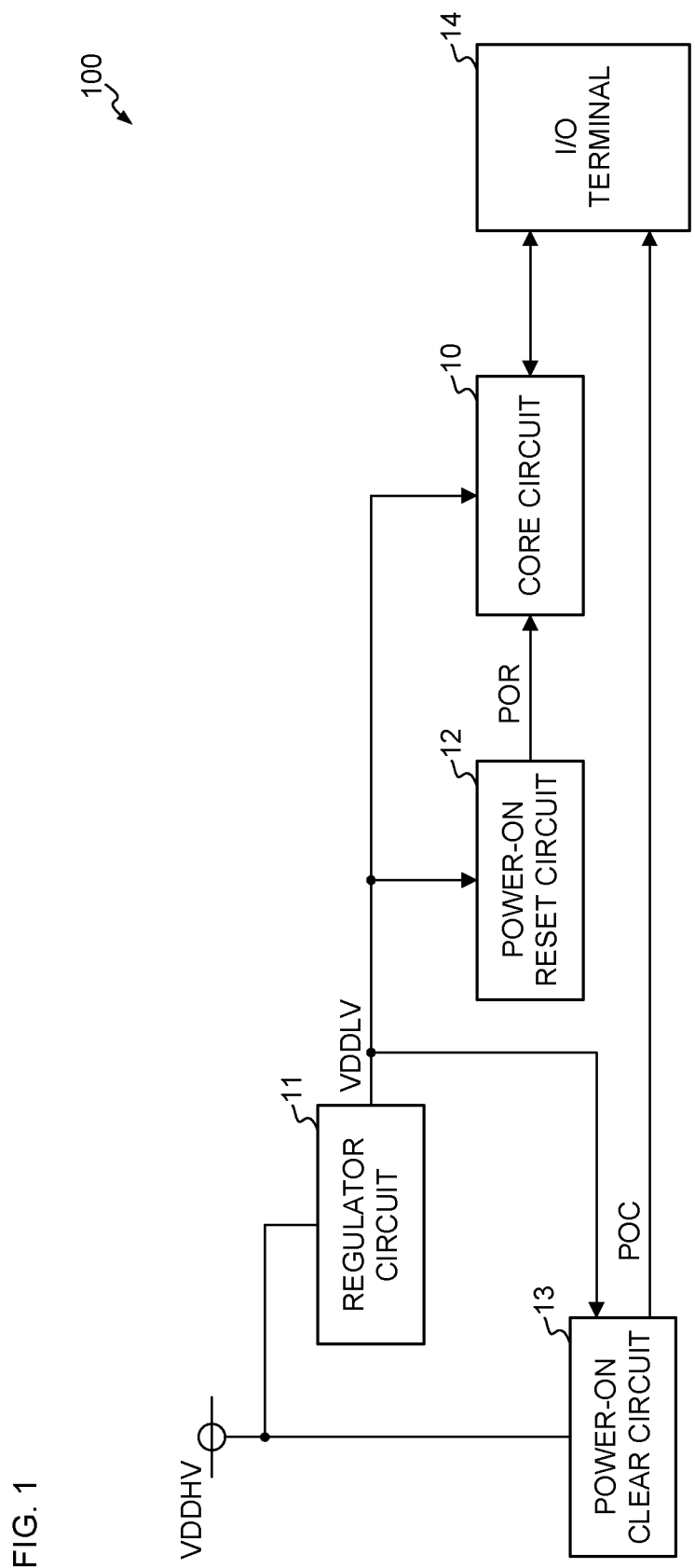
FIG. 1 is a block diagram showing a configuration of a semiconductor device of a first embodiment.

Preferred embodiments of the present invention will be described in detail below. In the following description of each of the embodiments and the accompanying drawings, substantially the same or equivalent parts are denoted by the same reference numerals.

First Embodiment

FIG. 1 is a block diagram showing a configuration of a semiconductor device 100 of the first embodiment of the present invention. The semiconductor device 100 includes a core circuit 10, a regulator circuit 11, a power-on reset circuit 12, a power-on clear circuit 13, and an I/O terminal 14. A high power supply voltage VDDHV is supplied to the semiconductor device 100 from the outside.

The core circuit 10 is a circuit serving as a main function of the semiconductor device 100, and operates by receiving supply of a low power supply voltage VDDLV.

The regulator circuit 11 generates the low power supply voltage VDDLV as a power supply voltage for operating the core circuit 10 on the basis of the high power supply voltage VDDHV. The regulator circuit 11 supplies the generated low power supply voltage VDDLV to the core circuit 10, the power-on reset circuit 12, and the power-on clear circuit 13.

The voltage level of the low power supply voltage VDDLV changes according to a change in the voltage level (that is, in magnitude) of the high power supply voltage VDDHV so as to follow with a slight delay from the level change of the high power supply voltage VDDHV. For example, when the high power supply voltage VDDHV changes (that is, rises) from a logic level "0" (hereinafter referred to as an "L level") to a logic level "1" (hereinafter referred to as an "H level"), the low power supply voltage VDDLV also changes from the L level to the H level after a predetermined period of time. When the high power supply voltage VDDHV changes (that is, falls) from the H level to the L level, the low power supply voltage VDDLV also changes from the H level to the L level after the predetermined period of time. The low power supply voltage VDDLV has a voltage level lower than the H level of the high power supply voltage VDDHV in the state of the H level.

The power-on reset circuit 12 generates a power-on reset signal POR on the basis of the high power supply voltage VDDHV, the low power supply voltage VDDLV, and a ground potential VSS, and supplies the power-on reset signal POR to the core circuit 10. The power-on reset signal POR is a signal that has the H level or the L level and controls a state of the core circuit 10. For example, a circuit element such as a flip-flop or the like and a function module (not shown) included in the core circuit 10 are set to a reset state by receiving supply of the power-on reset signal POR of the H level, and are released from the reset state by receiving supply of the power-on reset signal POR of the L level.

The power-on clear circuit 13 generates a power-on clear signal POC on the basis of the high power supply voltage VDDHV, the low power supply voltage VDDLV, and the ground potential VSS, and supplies the power on clear signal POC to the I/O terminal 14. The power-on clear signal POC is a signal which has the H level or the L level and controls a state of the I/O terminal 14. For example, the power-on clear signal POC controls the I/O terminal 14 to a high-impedance state (Hi-Z) during a period from the reset state of the core circuit 10 to the release of the reset state.

The I/O terminal 14 is an input/output terminal that functions as an input terminal that receives a signal and an output terminal that outputs a signal.

Figure 2:
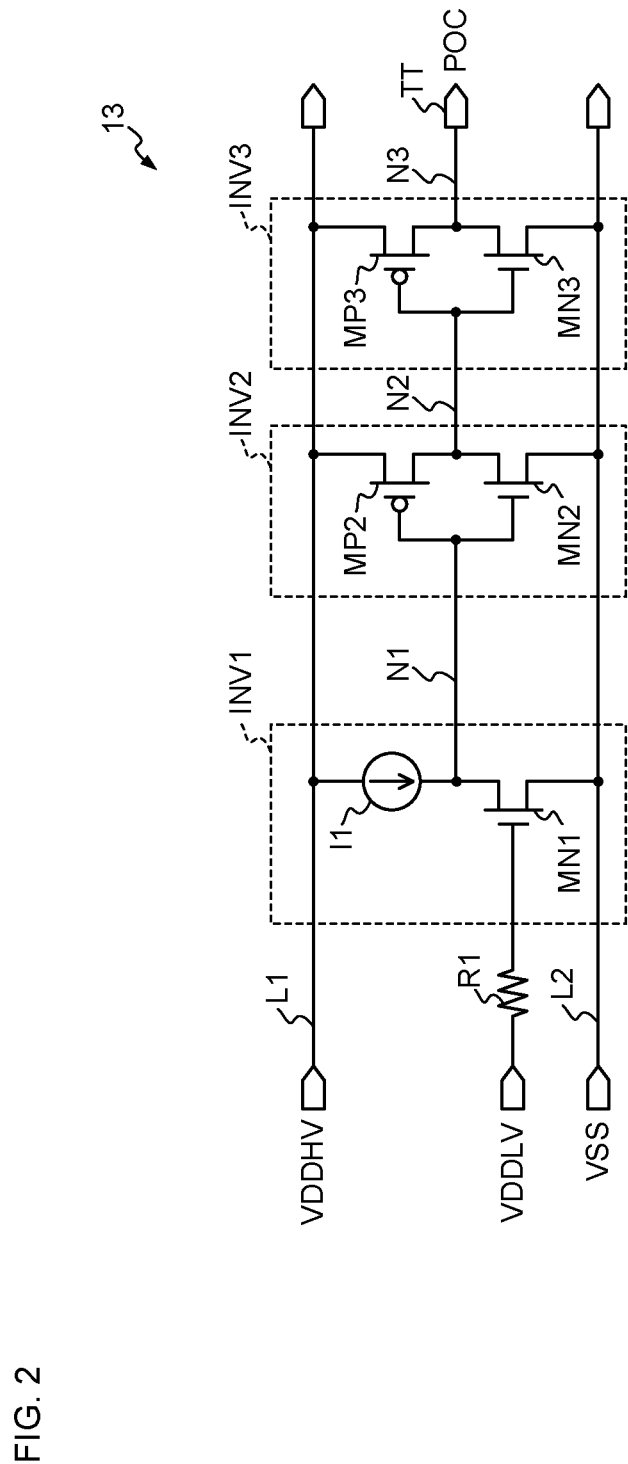
FIG. 2 is a circuit diagram showing a configuration of a power-on clear circuit of the first embodiment.

FIG. 2 is a circuit diagram showing an example of the configuration of the power-on clear circuit 13. The power-on clear circuit 13 includes a plurality of stages of inverter circuits including inverters INV1, INV2, and INV3.

The inverter INV1 is an inverter circuit located at the first stage of the inverter circuits in the plurality of stages. The inverter INV1 operates on the basis of the high power supply voltage VDDHV and the ground potential VSS, and receives supply of the low power supply voltage VDDLV so as to output an inverted signal from its output to a node N1. The inverter INV1 includes a constant current source I1 and a transistor MN1.

The transistor MN1 is composed of, for example, an N-channel MOSFET which is a transistor of a first conductivity type. The transistor MN1 has a source (a first terminal) connected to a ground line L2 which is a transmission line of the ground potential VSS. The transistor MN1 further has a drain (a second terminal) connected to the node N1 and a gate (a control terminal) connected to a resistor R1, and the low power supply voltage VDDLV is supplied to the gate through the resistor R1.

One end of the constant current source I1 is connected to a power supply line L1 which is a transmission line of the high power supply voltage VDDHV, and the other end thereof is connected to the drain of the transistor MN1 and the node N1. The constant current source I1 generates a constant current on the basis of the high power supply voltage VDDHV, and supplies the constant current to the drain of the transistor MN1 and the node N1.

The inverter INV2 is an inverter circuit of the second stage that further inverts the output of the inverter INV1, which is the inverter circuit of the first stage. The inverter INV2 operates on the basis of the high power supply voltage VDDHV and the ground potential VSS, and outputs an inverted signal obtained by inverting a potential of the node N1 from its output to the node N2. The inverter INV2 includes a transistor MP2 and a transistor MN2.

Transistor MP2 is composed of a P-channel MOSFET which is a second conductivity type transistor which is opposite to the first conductivity type, for example. The transistor MP2 has a source (a first terminal) connected to the power supply line L1, a drain (a second terminal) connected to the node N2, and a gate (a control terminal) connected to the node N1.

The transistor MN2 is composed of, for example, an N-channel MOSFET which is a transistor of the first conductivity type. The transistor MN2 has a source (a first terminal) connected to the ground line L2, a drain (a second terminal) connected to the node N2 together with the drain of the transistor MP2, and a gate (a control terminal) connected to the node N1 together with the gate of the transistor MP2.

The inverter INV3 is a third stage inverter circuit that inverts the output of the inverter INV2, which is the inverter circuit of the second stage inverter circuit. The inverter INV3 operates on the basis of the high power supply voltage VDDHV and the ground potential VSS, and outputs a signal obtained by inverting a potential of the node N2 as a power-on clear signal POC. The inverter INV3 includes a transistor MP3 and a transistor MN3.

The transistor MP3 is composed of, for example, a p-channel MOSFET which is a transistor of the second conductivity type. The transistor MP3 has a source (a first terminal) connected to the power supply line L1, a drain (a second terminal) connected to an output terminal TT of the power-on clear signal POC via a node N3, and a gate (a control terminal) connected to the node N2.

The transistor MN3 is composed of, for example, an N-channel MOSFET which is a transistor of the first conductivity type. The transistor MN3 has a source (a first terminal) connected to the ground line L2, a drain (a second terminal) connected to the output terminal TT through the node N3 together with the drain of the transistor MP3, and a gate (a control terminal) connected to the node N2 together with the gate of the transistor MP3.

Next, an operation of the power-on clear circuit 13 of the first embodiment will be described with reference to an operation of a power-on clear circuit of a comparative example.

Figure 3:
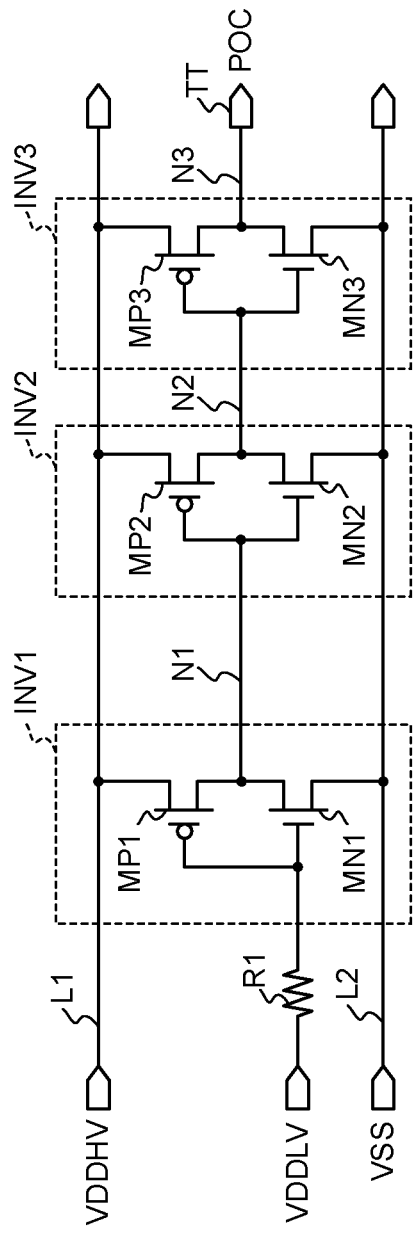
FIG. 3 is a circuit diagram showing a configuration of a power-on clear circuit of a comparative example.

FIG. 3 is a circuit diagram showing a configuration of the power-on clear circuit of the comparative example having a configuration of the inverter INV1 different from that of the power-on clear circuit 13 of the first embodiment. In the power-on clear circuit of the comparative example, the inverter INV1 includes a transistor MP1 instead of the constant current source I1 of the first embodiment. The transistor MP1 is composed of, for example, a P-channel MOSFET, and has a source connected to the power supply line L1, a drain connected to the node N1 together with the drain of the transistor MN1, and a gate connected to the resistor R1 together with the gate of the transistor MN1 to receive supply of the low power supply voltage VDDLV.

Figure 4:
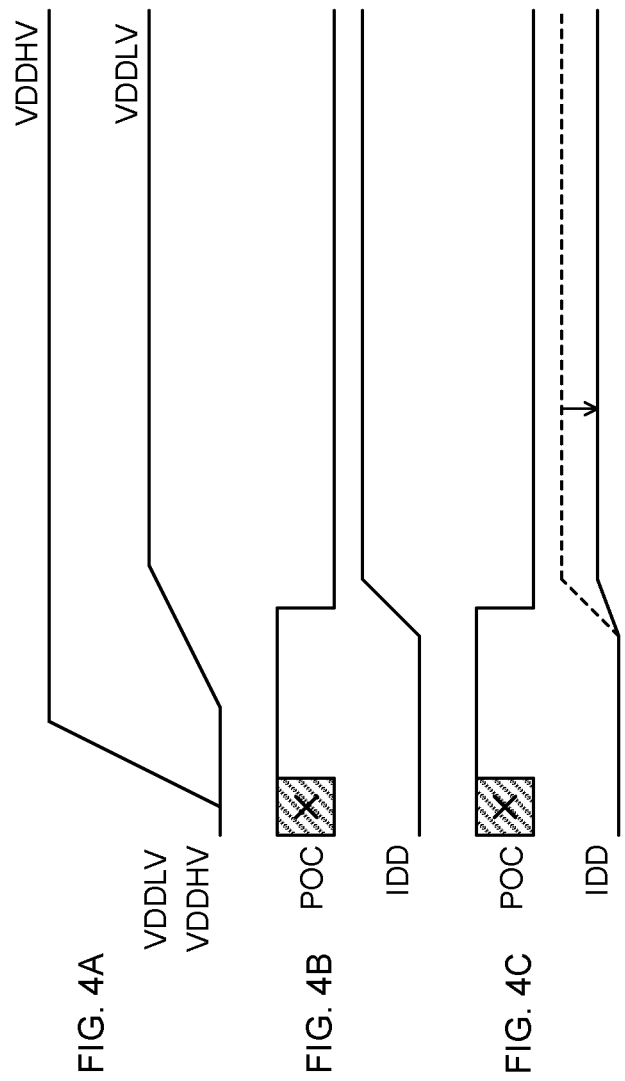
FIG. 4A to FIG. 4C are diagrams showing operation waveforms of the power-on clear circuit of the first embodiment as compared with operation waveforms of the comparative example.

FIG. 4A to FIG. 4C are diagrams showing a waveform of the power-on clear signal POC output from the power-on clear circuit 13 of the first embodiment and a waveform of a total current IDD obtained by summing currents flowing through the inverters as compared with waveforms of the power-on clear circuit of the comparative example. FIG. 4A shows waveforms of the high power supply voltage VDDHV rises and the low power supply voltage VDDLV, FIG. 4B shows waveforms of the power-on clear circuit of the comparative example, and FIG. 4C shows waveforms of the power-on clear circuit 13 of the first embodiment.

In a state where the high power supply voltage VDDHV rises and the low power supply voltage VDDLV has not yet risen, in the power-on clear circuit of the comparative example, the transistor MP1 of the is turned on and the transistor MP2 is turned off, so that the potential of the node N1 becomes an H level. Similarly, in the power-on clear circuit 13 of the first embodiment, the potential of the node N1 is increased by the output current of the constant current source I1, and becomes the H level. Thus, in both the comparative example and the first embodiment, the transistor MP2 of the inverter INV2 is turned off, and the transistor MN2 is turned on, so that the potential of the node N2 becomes an L level.

Since the potential of the node N2 is the L level, the transistor MP3 of the inverter INV3 is turned on, and the transistor MN3 is turned off, so that the potential of the node N3 becomes the H level. Thereby, the power-on clear signal POC having the H level is output.

Next, when the low power supply voltage VDDLV rises, the transistor MN1 is turned on, so that the potential of the node N1 is decreased. Further, since the potential of the node N2 increased and the potential of the node N3 is decreased, the power-on clear signal POC having the L level is output.

In a period in which the power-on clear signal POC transitions from the H level to the L level, when the voltage level of the low power supply voltage VDDLV becomes such an intermediate potential that both of the transistors MP1 and MN1 of the comparative example are simultaneously turned on, a through current flows through the inverter INV1 in the power-on clear circuit of the comparative example, so that the current amount of the total current IDD increases.

In contrast, in the power-on clear circuit 13 of the first embodiment, even when the voltage level of the low power supply voltage VDDLV becomes the intermediate potential, the current flowing through the inverter INV1 is limited to the output current of the constant current source I1, so that the increase in the current amount can be suppressed. That is, as shown in FIG. 4B, the current amount of the total current IDD is reduced from the current amount (that is, the current amount of the comparative example) indicated by a broken line to the current amount indicated by a solid line.

As described above, according to the power-on clear circuit 13 of the first embodiment, the inverter INV1 is formed by using the constant current source I1 instead of the P-channel MOSFET, so that the current amount of the current flowing through the inverter INV1 can be suppressed to the limit of the output current of the constant current source I1. Therefore, even when the voltage level of the low power supply voltage VDDLV becomes the intermediate potential level, it is possible to suppress the increase of the total current IDD due to the through current.

An additional circuit configuration may be added to the configuration of the power-on clear circuit 13 shown in FIG. 2.

Figure 5:
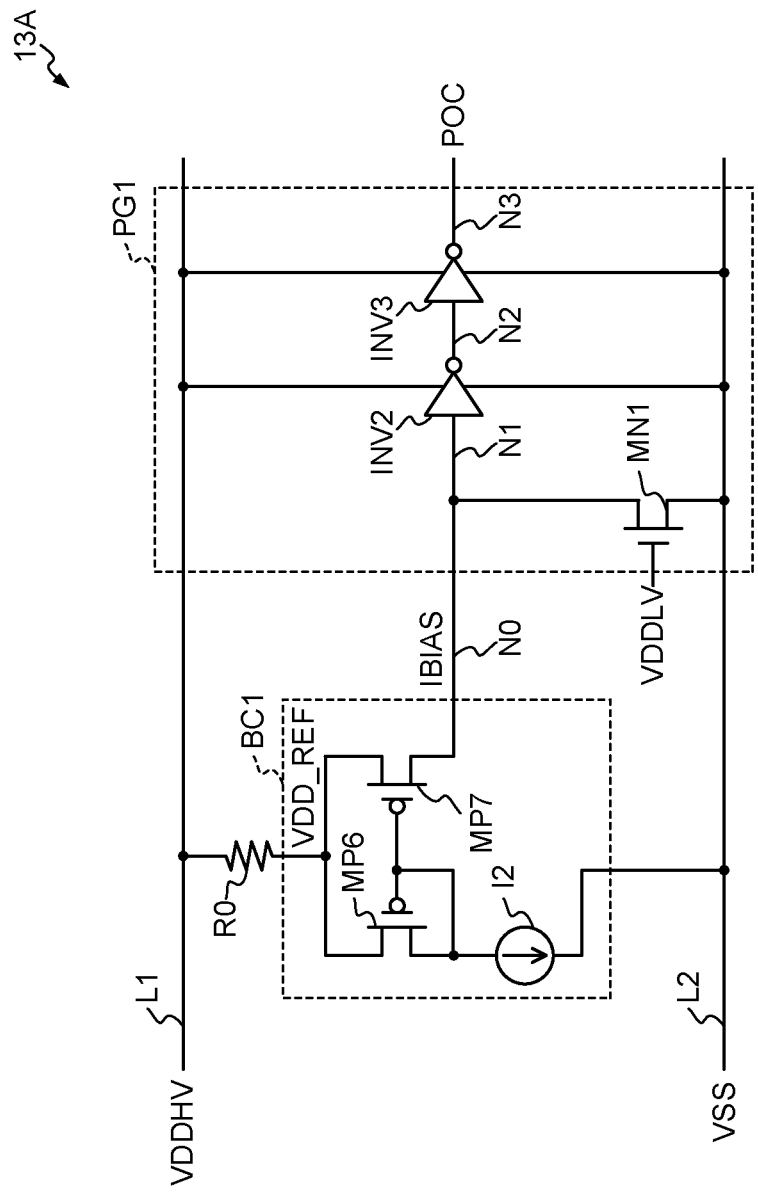
FIG. 5 is a circuit diagram showing a modification of the power-on circuit of the first embodiment.

FIG. 5 is a circuit diagram showing a configuration of a power-on clear circuit 13A which is a modification of the power-on clear circuit of the first embodiment. The power-on clear circuit 13A comprises a bias current generation circuit BC1 and a power-on clear signal generator PG1.

The power-on clear signal generator PG1 includes a transistor MN1, an inverter INV2, and an inverter INV3, which correspond to the transistor MN1, and the inverters INV2 and INV3 in the power-on clear circuit 13 shown in FIG. 2, respectively.

The bias current generation circuit BC1 includes transistors MP6 and MP7, and a constant current source I2. The bias current generation circuit BC1 is connected to the power supply line L1 via a resistor R0. The resistor R0 has a function as a current limiting resistor that limits the current amount of a current flowing from the power supply line L1 to the bias current generation circuit BC1.

Transistors MP6 and MP7 are each composed of a P-channel MOSFET which is a second conductivity type transistor, for example. Each of the transistors MP6 and MP7 has a source (a first terminal) connected to one end of a resistor R0. The other end of the resistor R0 is connected to the power supply line L1.

The transistor MP6 is diode-connected by having a drain (a second terminal) and a gate (a control terminal) which are connected to each other. The drain and the gate are connected to one end of the constant current source I2. The other end of the constant current source I2 is connected to the ground line VSS.

The transistor MP7 has a gate (a control terminal) connected to the gate of the transistor MP6, and a drain (a second terminal) connected to a node N0. The node N0 is connected to the drain of the transistor MN1 and an input line of the inverter INV2 in the power-on clear signal generator PG1.

The bias current generation circuit BC1 generates a bias current IBIAS and supplies the bias current IBIAS to the node N1 via the node N0.

A current value of the bias current IBIAS is limited to a predetermined current value or less by the resistor R0 as a current limiting resistor and the constant current source I2. As a result, a current flowing through the transistor MN1 is limited, so that an increase in the amount of the current is suppressed. That is, the bias current generation circuit BC1 operates a function similar to the constant current source I1 of the power-on clear circuit 13 shown in FIG. 2.

As described above, similarly to the power-on clear circuit 13 shown in FIG. 2, the power-on clear circuit 13A shown in FIG. 5 has a function of suppressing an increase in the total current IDD due to the through-current. According to the power-on clear circuit having such a configuration, it is possible to suppress an increase in current consumption of the entire circuit.

Second Embodiment

Next, a second embodiment of the present invention will be described below in detail. A semiconductor device of the second embodiment has a power-on clear circuit with a configuration different from that of the first embodiment.

Figure 6:
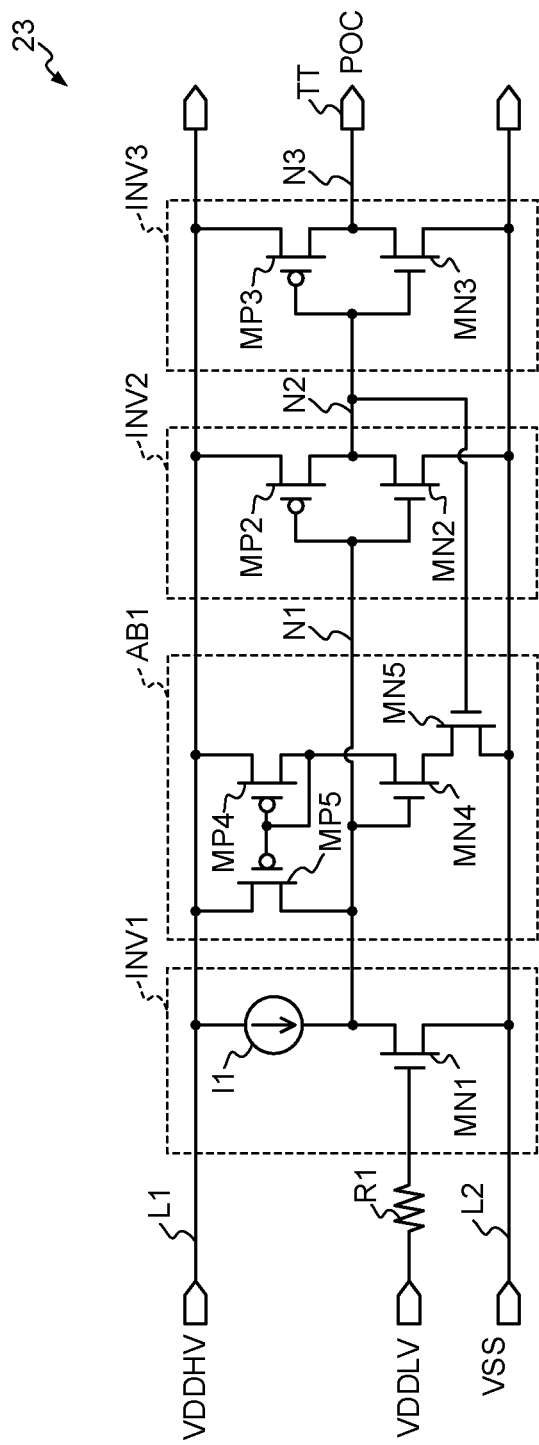
FIG. 6 is a circuit diagram showing a configuration of a power-on clear circuit of a second embodiment.

FIG. 6 is a circuit diagram showing an example of the configuration of a power-on clear circuit 23 of the second embodiment. The power-on clear circuit 23 is different from the power-on clear circuit 13 of the first embodiment in that it includes an adaptive bias circuit AB1 in addition to the inverters INV1, INV2, and INV3.

The adaptive bias circuit AB1 is arranged between the inverters INV1 and INV2, and is connected to the power supply line L1 and the ground line L2. The adaptive bias circuit AB1 includes a transistor MP4, a transistor MP5, a transistor MN4, and a transistor MN5.

Transistors MP4 and MP5 are each composed of a P-channel MOSFET which is a transistor of the second conductivity type. The transistor MP4 has a source (a first terminal) connected to the power supply line L1. Transistor MP4 is diode-connected, that is, its gate (a control terminal) and drain (a second terminal) are connected to each other. The transistor MP5 has a source (a first terminal) connected to the power supply line L1, a drain (a second terminal) connected to the node N1, and a gate (a control terminal) connected to the gate and the drain of the transistor MP4. Since the transistors MP4 and MP5 are configured as a current mirror circuit, a current having the same amount of current as a current flowing through the transistor MP4 flows through the transistor MP5.

The transistors MN4 and MN5 are each composed of an N-channel MOSFET which is a transistor of the first conductivity type. The transistor MN4 has a drain (a second terminal) connected to the drain of the transistor MP4, a gate (a control terminal) connected to the node N1, and a source (a first terminal) connected to a drain (a second terminal) of the transistor MN5. The transistor MN5 has a source (a first terminal) connected to the ground line L2, and a gate (a control terminal) connected to the node N2.

The adaptive bias circuit AB1 is a circuit for supplying a current to the node N1 at the time when the low power supply voltage VDDLV rises and falls. Thus, when the low power supply voltage VDDLV corresponding to the H level state once falls and then rises again, an effect that the rising of the power-on clear signal POC is accelerated is obtained. This will be described below.

Figure 7:
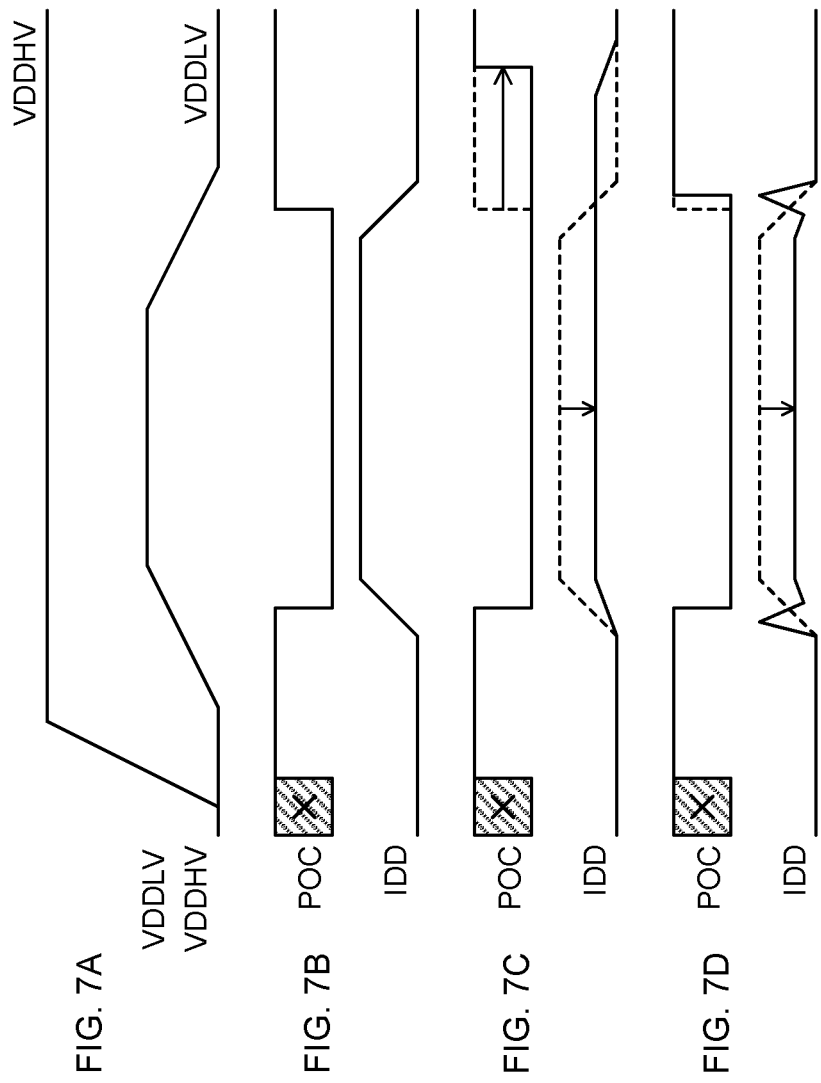
FIG. 7A to FIG. 7D are diagrams showing operation waveforms of the power-on clear circuit of the second embodiment as compared with the operation waveforms of the comparative example.

FIG. 7A to FIG. 7D are diagrams showing a waveform of the power-on clear signal POC, and a waveform of a total current IDD obtained by summing the currents flowing through the inverters in the power-on clear circuit 23 as compared with waveforms of the power-on clear circuit (FIG. 3) of the comparative example, and waveforms of the power-on clear circuit 13 (FIG. 2) of the first embodiment. FIG. 7A shows waveforms of the high power supply voltage VDDHV rises and the low power supply voltage VDDLV, FIG. 7B shows waveforms of the power-on clear circuit of the comparative example, FIG. 7C shows waveforms of the power-on clear circuit 13 of the first embodiment, and FIG. 7D shows waveforms of the power-on clear circuit 23 of the second embodiment.

In a state where the high power supply voltage VDDHV rises and the low power supply voltage VDDLV has yet risen, in the power-on clear circuit of the comparative example, the transistor MP1 is turned on, and the transistor MP2 is turned off, so that the potential of the node N1 becomes the H level. Similarly, in the power-on clear circuit 13 of the first embodiment and the power-on clear circuit 23 of the second embodiment, the potential of the node N1 is increased by the output current of the constant current source I1, and becomes the H level. As a result, in each of the power-on clear circuits 13 and 23, the transistor MP2 of the inverter INV2 is turned off and the transistor MN2 is turned on, so that the potential of the node N2 becomes the L level.

Since the potential of the node N2 is the L level, the transistor MP3 of the inverter INV3 is turned on, and the transistor MN3 is turned off, so that the potential of the node N3 becomes the H level. Thus, the power-on clear signal POC having the H level is output.

Next, when the low power supply voltage VDDLV rises, the transistor MN1 is turned on, and the potential of the node N1 is decreased. When the potential of the node N2 is increased and the potential of the node N3 is decreased, the power-on clear signal POC having the L level is output.

In a period in which the power-on clear signal POC transitions from the H level to the L level, in the power-on clear circuit of the comparative example, when the voltage level of the low power supply voltage VDDLV becomes the intermediate potential and the transistors MP1 and MN1 are turned on at the same time, the through current flows through the inverter INV1, and the current amount of the total current IDD increases.

In the power-on clear circuit 13 of the first embodiment, since the current flowing in the inverter INV 1 is limited to the output current of the constant current source I1, even when the voltage level of the low power supply voltage VDDLV becomes the intermediate potential, an increase in the current amount is suppressed. Accordingly, as shown in FIG. 7C, the current amount of the total current IDD is reduced from the current amount (I. e., the current amount of the comparative example) indicated by a broken line to the current amount indicated by a solid line.

In contrast to this, in the power-on clear circuit 23 of the second embodiment, when the voltage level of the low power supply voltage VDDLV becomes the intermediate potential, the transistors MN4 and MN5 are turned on. By the current mirror of the transistors MP4 and MP5, a current having the same current amount as a current flowing between the source and drain of the transistor MP4 flows between the source and drain of the transistor MP5 and then flows into the node N1. Therefore, in a period in which the power-on clear signal POC transitions from the L level to the H level, the current amount of the total current IDD temporarily increases as indicated by a solid line in FIG. 7D.

When the voltage level of the low power supply voltage VDDLV rises beyond the intermediate potential, the transistors MP4 and MP5 are turned off, so that no current flows from the transistor MP5 to the node N1. As a result, the current amount of the total current IDD in the second embodiment becomes the same amount as the total current IDD of the first embodiment.

When the regulator circuit 11 shown in FIG. 1 is powered down due to disturbance or the high power supply voltage VDDHV is momentarily interrupted, the low power supply voltage VDDLV falls and transitions from the H level to the L level. At this time, in the power-on clear circuit 13 of the first embodiment, since the current amount of the total current IDD is smaller than that of the power-on clear circuit of the comparative example, the change in the potentials of the nodes N1, N2, and N3 is delayed. As a result, as shown in FIG. 7C, a time point when the power-on clear signal POC changes from the L level to the H level again is delayed. That is, the output delay of the power-on clear signal POC is large.

In the power-on clear circuit 23 of the second embodiment, when the low power supply voltage VDDLV falls to the intermediate potential, both of the transistors MP4 and MP5 are turned on, and a current having the same current amount as a current flowing between the source and drain of the transistor MP4 flows between the source and drain of the transistor MP5. Then, the current flows into the node N1 as in the case of the rising of the low power supply voltage VDDLV. As a result, in a period in which the power-on clear signal POC transitions from the H level to the L level, as indicated by a solid line in FIG. 7D, the current amount of the total current IDD temporarily increases.

As described above, in the power-on clear circuit 23 of the second embodiment, the pull-up current flowing through the transistor MP5, which is the current that increases the amount of current, is superimposed as an auxiliary current to the output current of the constant current source I1 in a period in which the potential of the low power supply voltage VDDLV changes from the H level to the L level and in a period in which the potential changes from the L level to the H level. Therefore, as shown in FIG. 7D, the charging time of the node N1 due to the output of the inverter INV1 is shortened, and the output delay of the power-on clear signal POC can be reduced.

When the low power supply voltage VDDLV changes from the L level to the H level, the pull-down current flowing through the transistor MN1, which is the current decreases the amount of current, competes with the pull-up current flowing through the transistor MP5. However, by adjusting the size (channel width or channel length) of each transistor so that the pull-down current is larger than the pull-up current, the potential of the node N1 can be lowered to the L level.

The auxiliary current is generated only when the potential of the low power supply voltage VDDLV changes from the L level to the H level and when the potential changes from the H level to the L level, and current consumption in a steady state does not increase. Therefore, it is possible to suppress the current consumption in comparison with the power-on clear circuit of the comparative example.

As described above, according to the power-on clear circuit 23 of the second embodiment, it is possible to suppress the output delay of the power-on clear signal POC while suppressing the increase in the current consumption.

Third Embodiment

Next, a third embodiment of the present invention will be described below. A semiconductor device of the third embodiment has a power-on clear circuit with a configuration different from those of the first and second embodiments.

Figure 8:
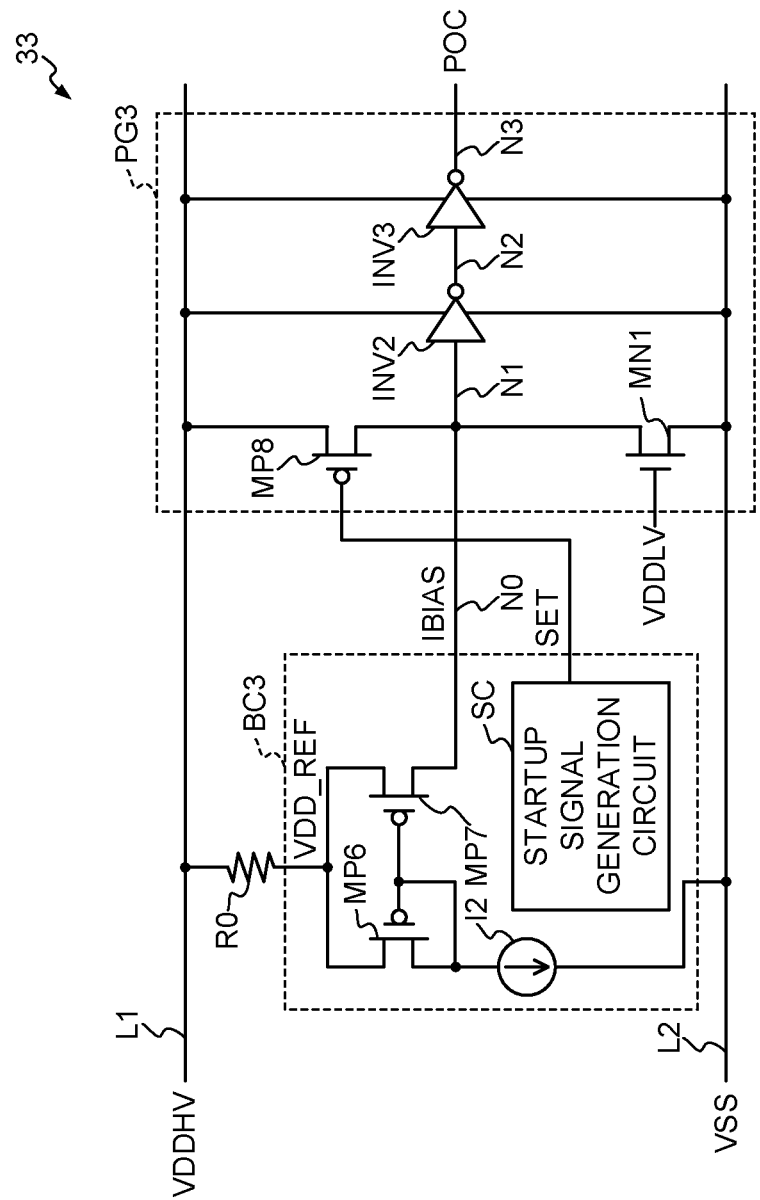
FIG. 8 is a circuit diagram showing a configuration of a power-on clear circuit of a third embodiment.

FIG. 8 is a circuit diagram showing a configuration of a power-on clear circuit 33 of the third embodiment. The power-on clear circuit 33 includes a bias current generation circuit BC3 and a power-on clear signal generator PG3.

The power-on clear signal generator PG3 includes a transistor MP8 in addition to the configuration of the power-on clear signal generator PG1 shown in FIG. 5 which is a modification of the first embodiment. The transistor MP8 is composed of, for example, a P-channel MOSFET which is a transistor of the second conductivity type. The transistor MP8 has a source (a first terminal) connected to the power supply line L1, and a drain (a second terminal) connected to an input terminal of the inverter INV2 and the drain of the transistor MN1 via the node N1.

The bias current generation circuit BC3 includes a startup signal generation circuit SC for generating a startup signal SET in addition to the configuration of the bias current generation circuit BC1 shown in FIG. 5 which is the modification of the first embodiment. The startup signal SET is a reset signal for resetting an internal logic circuit (not shown) in the core circuit 10. The startup signal SET has a signal level that changes from the L level to the H level following the rising of the high power supply voltage VDDHV. The startup signal generation circuit SC supplies the startup signal SET to the internal logic circuit in the core circuit 10, and supplies the startup signal SET to the gate (a control terminal) of the transistor MP8.

Next, an operation of the power-on clear circuit 33 of the third embodiment will be described with reference to the operation of the power-on clear circuit 13A of the modification of the first embodiment shown in FIG. 5.

Figure 9:
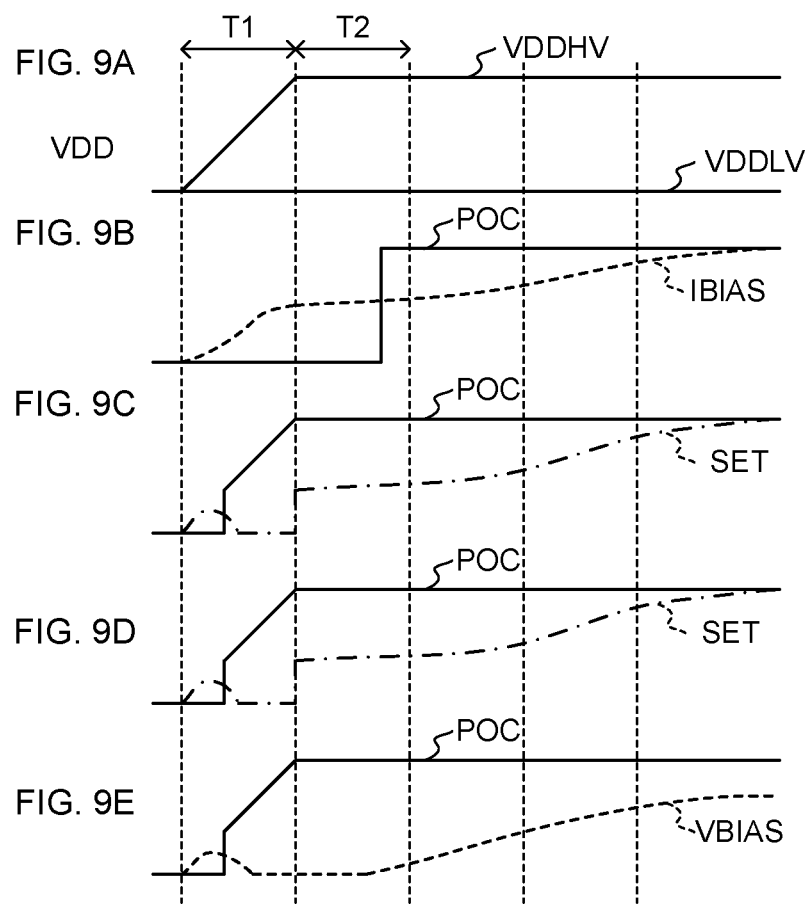
FIG. 9A to FIG. 9E are diagrams showing a comparison between operation waveforms of a plurality of power-on clear circuits.

FIG. 9A to FIG. 9C are diagrams showing a comparison between the rising of the power-on clear signal POC in the power-on clear circuit 13A in the first embodiment and the rising of the power-on clear signal POC in the power-on clear circuit 33 in the third embodiment. A solid line shown in FIG. 9B represents a waveform of the power-on clear signal POC of the first embodiment, and a solid line shown in FIG. 9C represents a waveform of the power-on clear signal POC of the third embodiment. Here, a period in which the high power supply voltage VDDHV rises while the low power supply voltage VDDLV has not risen yet is shown in FIG. 9A. That is, the high power supply voltage VDDHV rises during a period T1, and when the period T1 elapses and then transitions to a period T2, the startup signal SET becomes the H level.

In the period T1, in the power-on clear circuit 13A shown in FIG. 5 which is the modification of the first embodiment, the source potential VDD_REF of the transistors MP6 and MP7 is reduced by a startup current of the bias current generating circuit BC1, and the potential IBIAS of the node N0 becomes a voltage level near the intermediate potential. Therefore, it takes time for the potential of the node N1 to exceed a threshold value of the inverter INV2, and as indicated by the solid line in FIG. 9B, the signal level of the power-on clear signal POC becomes the H level in the period T2.

In contrast to this, in the power-on clear circuit 33 of the third embodiment, the transistor MP8 is connected in the form of a wired-OR as shown in FIG. 8. The signal level of the startup signal SET is stable in the middle of the period T1, and becomes the L level. Therefore, the startup signal SET having the L level is supplied to the gate of the transistor MP8 from the middle of the period T1. In response to the L level startup signal SET, the transistor MP8 is turned on, so that a current flowing through the transistor MP8 flows into the node N1. Thus, the potential of the node N1 is increased, and the time required to exceed the threshold value of the inverter INV2 is reduced. As a result, as indicated by the solid line in FIG. 9C, the power-on clear signal POC rises from the middle of the period T1, and becomes the state of the H level at the time when the transition to the period T2 is reached. That is, in the power-on clear circuit 33 of the third embodiment, a response time until the power-on clear signal POC becomes the H level is shorter than that in the case of the first embodiment.

If the time period until the power-on clear signal POC becomes the H level is relatively long, a state in which a potential of the I/O terminal 14 on the side receiving the power-on clear signal POC is indefinite occurs, so that there arises a problem that a through current is generated. In contrast, according to the power-on clear circuit 33 of the third embodiment, since the power-on clear signal POC becomes the H level quickly, it is possible to suppress the occurrence of such a problem.

As described above, according to the power-on clear circuit 33 of the third embodiment, it is possible to shorten the response time (that is, the time required to reach the H level) of the power-on clear signal POC at the time of the rising of the high power supply voltage VDDHV.

Fourth Embodiment

Next, a fourth embodiment of the present invention will be described below. A semiconductor device of the fourth embodiment has a power-on clear circuit with a configuration different from those of the first to third embodiments.

Figure 10:
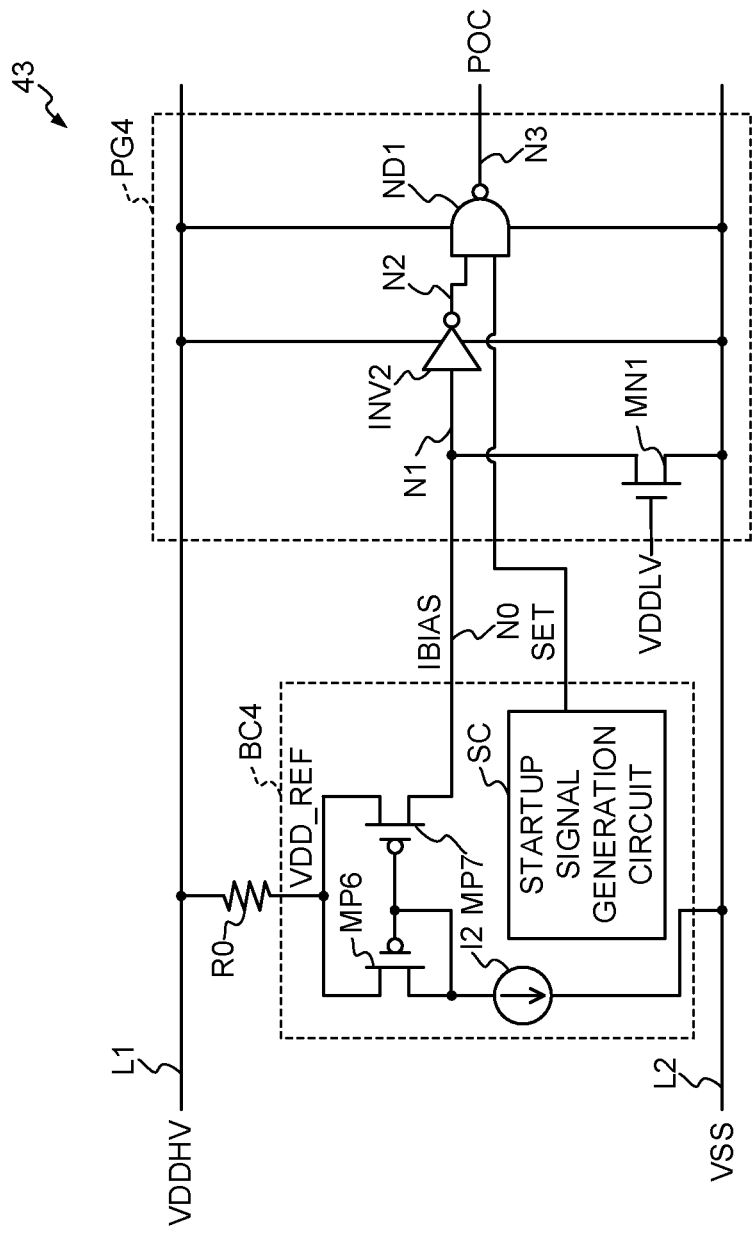
FIG. 10 is a circuit diagram showing a configuration of a power-on clear circuit of a fourth embodiment.

FIG. 10 is a circuit diagram showing a configuration of a power-on clear circuit 43 of the fourth embodiment. The power-on clear circuit 43 includes a bias current generation circuit BC4 and a power-on clear signal generator PG4.

The power-on clear signal generator PG4 includes a NAND gate circuit ND1 instead of the inverter INV3 of the power-on clear signal generator PG1 shown in FIG. 5 which is the modification of the first embodiment. The NAND gate circuit ND1 is a two-input logic gate circuit, which is connected to the node N3, and outputs a negative logical product of signals input to a pair of input terminals as a power-on clear signal POC from an output terminal. One of the input terminals of the NAND gate circuit ND1 is connected to an output terminal of the inverter INV2 via the node N2. The other of the input terminals of the NAND gate circuit ND1 is connected to the startup signal generation circuit SC. The output terminal of the NAND gate circuit ND1 is connected to the node N3.

The bias current generation circuit BC4 includes a transistor MP6, a transistor MP7, a constant current source I2, and a startup signal generation circuit SC. The configurations of the transistors MP6 and MP7 and the constant current source I2 are the same as those of the bias current generating circuit BC1 of the first embodiment shown in FIG. 5 and the bias current generation circuit BC3 of the third embodiment shown in FIG. 8. The startup signal generation circuit SC supplies a startup signal SET to an internal logic circuit (not shown) in the core circuit 10, and supplies the startup signal SET to the other of the input terminals of the NAND gate circuit ND1.

Next, an operation of the power-on clear circuit 43 of the fourth embodiment will be described with reference to FIG. 9A, FIG. 9B, and FIG. 9D as compared with the operation of the power-on clear circuit 13A of the first embodiment. A solid line shown in FIG. 9B represents a waveform of the power-on clear signal POC of the first embodiment, and a solid line shown in FIG. 9D represents a waveform of the power-on clear signal POC of the fourth embodiment.

In the period T1, in the power-on clear circuit 13A shown in FIG. 5 which is the modification of the first embodiment, the source potential VDD_REF of the transistors MP6 and MP7 is reduced by a startup current of the bias current generating circuit BC1, and the potential IBIAS of the node N0 becomes a voltage level near the intermediate potential. Therefore, it takes time to raise the potential of the node N1 to a level exceeding the threshold value of the inverter INV2. When the potential of the node N1 does not exceed the threshold value, the inverter INV2 does not operate, so that the potential of the node N2 does not change. In this way, it takes time for the potential of the node N2 to exceed a threshold value of the inverter INV3, so that the signal level of the power-on clear signal POC is delayed from becoming the H level. For example, as indicated by a solid line in FIG. 9B, the signal level of the power-on clear signal POC becomes the H level in the period T2.

In contrast to this, in the power-on clear circuit 43 of the fourth embodiment, the NAND gate circuit ND1 is provided instead of the inverter INV3, and outputs a negative logical product of the output signal of the inverter INV2 and the startup signal SET as a power-on clear signal POC. The NAND gate circuit is a circuit for outputting a signal having the H level when a signal having the L level is input to at least one of the pair of input terminals.

The signal level of the startup signal SET becomes stable in the middle of the period T1, and becomes the L level.

Thus, from the middle of the period T1, the L-level startup signal SET is supplied to the other of the input terminals of the NAND gate circuit ND 1. Therefore, the signal level of the power-on clear signal POC becomes the H level regardless of the potential of the node N2.

In the power-on clear circuit 43 of the fourth embodiment, the potential of the node N2 is masked by the startup signal SET. That is, the potential of the node N2 is prevented from affecting the signal level of the power-on clear signal POC. Thus, the period until the power-on clear signal POC becomes the H level is shortened as compared with the case of the first embodiment.

As described above, according to the power-on clear circuit 43 of the fourth embodiment, it is possible to shorten the response time (that is, the time required to reach the H level) of the power-on clear signal POC at the time of the rising of the high power supply voltage VDDHV.

Fifth Embodiment

Next, a fifth embodiment of the present invention will be described below. A semiconductor device of the fifth embodiment has a power-on clear circuit with a configuration different from those of the first to fourth embodiments.

Figure 11:
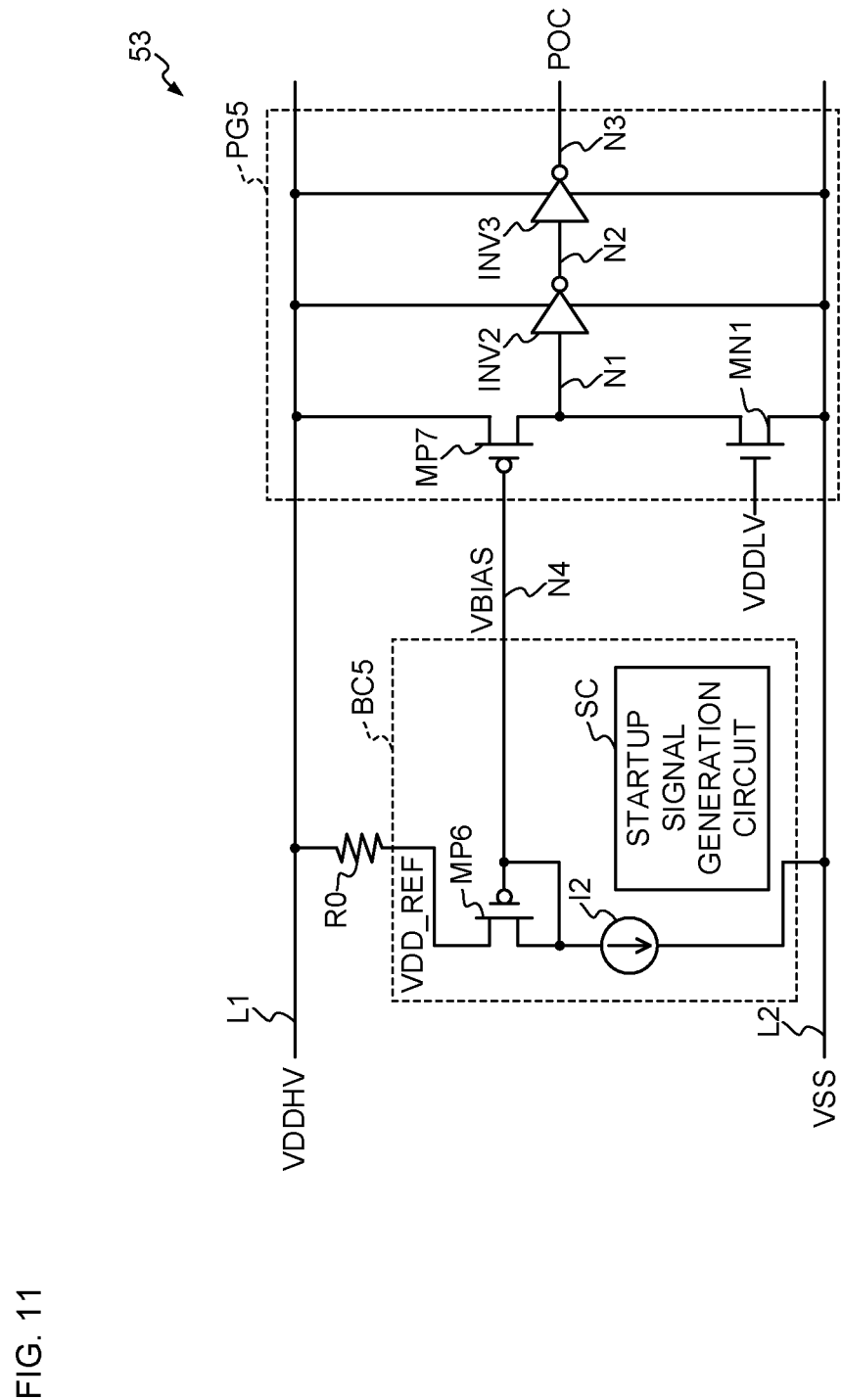
FIG. 11 is a circuit diagram showing a configuration of a power-on clear circuit of a fifth embodiment.

FIG. 11 is a circuit diagram showing a configuration of a power-on clear circuit 53 of the fifth embodiment. The power-on clear circuit 53 includes a bias current generation circuit BC5 and a power-on clear signal generator PG5.

The power-on clear signal generator PG5 includes a transistor MP7, a transistor MN1, an inverter INV2, and an inverter INV3. The configurations of the transistor MN1, the inverter INV2 and the inverter INV3 are the same as those of the power-on clear circuit 13A of the first embodiment shown in FIG. 5. In the transistor MP7 in the fifth embodiment, unlike the transistor MP7 in the other embodiments shown in FIG. 5, FIG. 8, and FIG. 10, its source is directly connected to the power supply line L1. The transistor MP7 forms an inverter circuit of a first stage of the power-on clear signal generating unit PG5 together with the transistor MN1.

The bias current generating circuit BC5 includes a transistor MP6, a constant current source I2, and a startup signal generating circuit SC. The gate of the transistor MP6 is connected to the gate of the transistor MP7 through a node N4. The transistor MP6 is diode-connected, and the drain and the gate thereof are connected to one end of a constant current source I2. The source of the transistor MP6 is connected to the power supply line L1 through a resistor R0. The other end of the constant current source I2 is connected to the ground line VSS.

Next, an operation of the power-on clear circuit 53 of the fifth embodiment will be described with reference to FIG. 9A, FIG. 9B, FIG. 9D, and FIG. 9E as compared with the operation of the power-on clear circuit 13A of the first embodiment. The solid line in FIG. 9B shows the waveform of the power-on clear signal POC of the first embodiment as described above, and a solid line shown in FIG. 9E represents a waveform of the power-on clear signal POC of the fifth embodiment.

In the period T1, in the power-on clear circuit 13A shown in FIG. 5 which is the modification of the first embodiment, the source potential VDD_REF of the transistors MP6 and MP7 is reduced, and the potential IBIAS of the node N0 becomes a voltage level near the intermediate potential. Therefore, it takes time to raise the potential of the node N1 to a level exceeding the threshold value of the inverter INV2, and as indicated by the solid line in FIG. 9B, the signal level of the power-on clear signal POC becomes the H level in the period T2.

In contrast to this, in the power-on clear circuit 53 of the fifth embodiment, when the high power supply voltage VDDHV rises in the period T1, the potential VBIAS of the node N4 is pulled to VSS by the startup signal, and then the source potential VDD_REF of the transistor MP6 is reduced. However, in the period T1, the low power supply voltage VDDLV is the L level (that is, the potential level of the ground potential VSS), and the potential VBIAS of the node N4 also becomes the potential level of the ground potential VSS, so that the potential level of the ground potential VSS is applied to the gates of the transistors MP7 and MN1 forming the inverter circuit of the first stage of the power-on clear signal generator PG5.

Accordingly, the input of the first stage inverter circuit formed by the transistors MP7 and MN1 does not become the intermediate potential, and no unnecessary through current is generated in the transistors MP7 and MN1. The potential of the node N1 is rapidly changed to the H level exceeding the threshold value of the inverter INV2, and the potential of the node N2 is rapidly changed to the L level exceeding the threshold value of the inverter INV3. Therefore, as indicated by the solid line in FIG. 9E, the signal level of the power-on clear signal POC output from the inverter INV3 is quickly set to the H level.

As described above, according to the power-on clear circuit 53 of the fifth embodiment, the source of the transistor MP7 is directly connected to the power line L1, and the potential of the node N1 does not become the intermediate potential, so that the period until the power-on clear signal POC becomes the H level is shortened as compared with the case of the first embodiment.

In the power-on clear circuit 53 of the fifth embodiment, unlike the power-on clear circuits of the third and fourth embodiments, no additional element (for example, the transistor MP8 in the third embodiment, the NAND gate circuit ND1 in the fourth embodiment and so on) is not required. Therefore, it is possible to reduce the response time (that is, the time required to reach the H level) of the power-on clear signal POC at the time of the rising of the high power supply voltage VDDHV without increasing a circuit scale.

It should be noted that the present invention is not limited to the above embodiments. In the first and second embodiments, the example in which the inverter INV1, which is the first-stage inverter circuit, is configured using the constant current source I1 has been described. However, instead of the constant current source I1, a resistor having a resistance value greater than or equal to a predetermined value (that is, a high resistance) may be used. In other words, it is sufficient to configure circuits so that the through current is limited to a predetermined amount of current.

In the above second embodiment, the example in which the current mirror circuit including the transistors MP4 and MP5 supplies the current having the same amount of current as the current flowing through the transistors MN4 and MN5 to the node N1 has been described. However, the current mirror circuit does not necessarily have to supply the current of the same current amount, but may be configured to supply a current proportional to the current flowing through the transistors MN4 and MN5 to the node N1.

Instead of the inverter circuit in each of the embodiments described above, a circuit for performing the same operation may be formed by using a NAND gate circuit or a NOR gate circuit.

In the above embodiments, the circuit in which the transistors MN1 to MN5 and MP1 to MP8 are configured by MOSFETs has been described as an example. However, the present invention is not limited thereto, and the circuit may be configured using other types of transistors having a first terminal, a second terminal, and a control terminal.

In the fifth embodiment, the configuration of the power-on clear circuit 53 shown in FIG. 11 is realized by changing the connection of the transistor MP7 in the modification of the first embodiment shown in FIG. 5. However, in addition to this configuration, for example, a similar configuration may be realized by changing the source of the transistor MP7 in the fourth embodiment shown in FIG. 10 to be directly connected to the power supply line L1.

In the first to fifth embodiments, the power-on clear circuit including three-stage inverters has been described as an example. However, the number of stages of the inverter is not limited to three. The power-on clear circuit may be constituted by a plurality of stages of inverters. That is, an inverter of the first stage and an input/output unit of the inverter of the plurality of stages may be configured as in the embodiments described above.

In the first and second embodiments described above, the example in which the resistor R1 is connected to the gate of the transistor MN1 and the low power supply voltage VDDLV is supplied through the resistor R1 has been described. However, there may be a configuration in which the low power supply voltage VDDLV is directly supplied to the gate of the transistor MN 1 without having such a resistor R1 and without passing through a resistance element.

In each of the power-on clear circuit of the modification of the first embodiment shown in FIG. 5 and the power-on clear circuits of the third to fifth embodiments shown in FIG. 8, FIG. 10 and FIG. 11, the example in which the bias current generation circuit is connected to the power line L1 through the resistor R0 has been described. However, the bias current generation circuit may be directly connected to the power supply line L1 without passing through such a current limiting resistor.

What is claimed is:

1. A power-on clear circuit comprising:
   a first inverter unit including
      a constant current transmission unit having one end thereof which is connected to a first line which is supplied with a first power supply voltage, said constant current transmission unit being configured to transmit therethrough a constant current from said one end to an other end thereof, and
      a first transistor having a first terminal which is connected to a second line which is kept at a fixed potential, a second terminal which is connected to the other end of said constant current transmission unit, and a control terminal for receiving application of a second power supply voltage which varies to follow in magnitude said first power supply voltage and which is smaller in magnitude than said first power supply voltage;
   a second inverter unit configured to operate on the basis of said first power supply voltage, and to which a potential of a first node is input, said first node is connected between the other end of said constant current transmission unit and the first terminal of said first transistor; and
   a signal outputting unit configured to output a power-on clear signal for controlling an operation state of another circuit operating on the basis of said second power supply voltage in accordance with an output of said second inverter unit,
   wherein the constant current transmission unit transmits the constant current having a constant current value regardless of a variation of the second power supply voltage which is applied to the control terminal of the first transistor.

2. A power-on clear circuit comprising:
   a first inverter unit including
      a constant current transmission unit having one end thereof which is connected to a first line which is supplied with a first power supply voltage, said constant current transmission unit being configured to transmit therethrough a constant current from said one end to an other end thereof, and
      a first transistor having a first terminal which is connected to a second line which is kept at a fixed potential, a second terminal which is connected to the other end of said constant current transmission unit, and a control terminal for receiving application of a second power supply voltage which varies to follow in magnitude said first power supply voltage and which is smaller in magnitude than said first power supply voltage;
   a second inverter unit configured to operate on the basis of said first power supply voltage, and to which a potential of a first node is input, said first node is connected between the other end of said constant current transmission unit and the first terminal of said first transistor;
   a signal outputting unit configured to output a power-on clear signal for controlling an operation state of another circuit operating on the basis of said second power supply voltage in accordance with an output of said second inverter unit; and
   an auxiliary current transmission circuit configured to transmit an auxiliary current to said first node in accordance with the potential of said first node and a potential of a second node connected between an output terminal of said first inverter unit and an input terminal of said signal outputting unit,
   wherein said first transistor is of a first conductivity type having the first terminal connected to the second line and the second terminal connected to the first node, and
   said auxiliary current transmission circuit comprises
      a second transistor of the first conductivity type having a first terminal connected to said second line and a control terminal connected to said second node;
      a third transistor of the first conductivity type having a first terminal connected to a second terminal of said second transistor and a control terminal connected to said first node; and
      a current mirror unit including a fourth transistor of a second conductivity type, which is opposite to the first conductivity type, having a first terminal connected to said first line and a second terminal connected to a second terminal of the third transistor, said current mirror unit being configured to transmit a current proportional to a current flowing through said second transistor and the third transistor to said first node as said auxiliary current, and
   said constant current transmission unit includes a resistance element having a resistance value equal to or greater than a predetermined value.

3. A semiconductor device comprising:
a regulator circuit configured to reduce in magnitude a first power supply voltage so as to generate a second power supply voltage;
a core circuit configured to operate on the basis of said second power supply voltage;
a signal input/output terminal connected to said core circuit; and
a power-on clear circuit connected to a first line which is supplied with said first power supply voltage and to a second line which is kept at a fixed potential, said power-on clear circuit being configured to generate a power-on clear signal for said signal input/output terminal on the basis of said second power supply voltage, wherein
said power-on clear circuit comprises:
a first inverter unit including
a constant current transmission unit having one end thereof which is connected to said first line, said constant current transmission unit being configured to transmit a constant current therethrough from said one end to an other end thereof, and
a first transistor having a first terminal which is connected to said second line, a second terminal which is connected to the other end of said constant current transmission unit, and a control terminal for receiving application of said second power supply voltage;
a second inverter unit configured to operate on the basis of said first power supply voltage, and input a potential of a first node connected between the other end of said constant current transmission unit and the first terminal of said first transistor; and
a signal outputting unit configured to output said power-on clear signal in accordance with an output of said second inverter unit.

4. The semiconductor device according to claim 3, further comprising an auxiliary current transmission circuit configured to transmit an auxiliary current to said first node in accordance with the potential of said first node and a potential of a second node connected between an output terminal of said first inverter unit and an input terminal of said signal outputting unit.

\* \* \* \* \*